(12) United States Patent
Kanbe

(10) Patent No.: US 8,525,242 B2  
(45) Date of Patent: Sep. 3, 2013

(54) SOLID-STATE IMAGE PICKUP DEVICE AND DRIVING METHOD OF SOLID-STATE IMAGE PICKUP DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 207 days.

(21) Appl. No.: 11/615,717

(22) Filed: Dec. 22, 2006

(65) Prior Publication Data

US 2007/0103575 A1 May 10, 2007

Related U.S. Application Data

(62) Division of application No. 10/854,422, filed on May 26, 2004.

(30) Foreign Application Priority Data

Jun. 2, 2003 (JP) ................................. P2003-156122

(51) Int. Cl.
*H01L 31/062* (2012.01)
*H01L 31/113* (2006.01)
*H01L 31/102* (2006.01)
*H01L 27/148* (2006.01)
*H01L 29/76* (2006.01)
*H01L 27/14* (2006.01)

(52) U.S. Cl.
USPC ........... 257/294; 257/184; 257/215; 257/288; 257/428; 348/294; 348/311

(58) Field of Classification Search
USPC .................... 348/275, 294–324; 438/73, 143, 438/75; 257/443, 448, 461, 184, 215, 225, 257/231–243, 288–294, 428, 431–435; 250/208.1
See application file for complete search history.

(56) References Cited

U.S. PATENT DOCUMENTS

| | | | |
|---|---|---|---|
| 4,814,848 A | | 3/1989 | Akimoto et al. |
| 5,514,887 A | * | 5/1996 | Hokari ........................... 257/222 |
| 5,514,888 A | * | 5/1996 | Sano et al. .................... 257/232 |
| 5,523,609 A | | 6/1996 | Fukusho |

(Continued)

FOREIGN PATENT DOCUMENTS

| JP | 58118173 A | 7/1983 |
|---|---|---|
| JP | 02002793 A | 1/1990 |

(Continued)

OTHER PUBLICATIONS

Ozaki. T., et al., IEEE Transaction on Electron Devices, vol. 41, No. 7, (1994) pp. 1134-1182.

*Primary Examiner* — Michael Osinski
(74) *Attorney, Agent, or Firm* — Dentons US LLP

(57) ABSTRACT

A solid-state image pickup device including: a pixel region on a semiconductor substrate, the pixel region including: a sensor region for photoelectrically converting incident light; a vertical CCD formed on one side of the sensor region with a readout region interposed between the sensor region and the vertical CCD; and a channel stop region formed on a side opposite from the sensor region with the vertical CCD interposed between the sensor region and the channel stop region; and a vertical transfer electrode on the vertical CCD with an insulating film interposed between the vertical transfer electrode and the vertical CCD. The vertical transfer electrode is formed above the vertical CCD such that width of the vertical transfer electrode and width of a channel region of the vertical CCD are substantially equal to each other.

10 Claims, 2 Drawing Sheets

(56) References Cited

U.S. PATENT DOCUMENTS

| | | | |
|---|---|---|---|
| 5,976,908 A * | 11/1999 | Kwon et al. | 438/69 |
| 6,734,031 B2 * | 5/2004 | Shizukuishi | 438/22 |
| 6,784,014 B2 * | 8/2004 | Tanigawa | 438/60 |
| 7,075,164 B2 * | 7/2006 | Uya | 257/431 |
| 7,453,130 B2 * | 11/2008 | Nakai | 257/432 |
| 2001/0032988 A1 * | 10/2001 | Yoshida et al. | 257/226 |
| 2001/0042875 A1 * | 11/2001 | Yoshida | 257/291 |
| 2002/0048840 A1 * | 4/2002 | Tanigawa | 438/65 |
| 2003/0122209 A1 * | 7/2003 | Uya | 257/435 |
| 2003/0168679 A1 * | 9/2003 | Nakai et al. | 257/291 |
| 2003/0170928 A1 * | 9/2003 | Shimozono et al. | 438/73 |
| 2004/0012707 A1 * | 1/2004 | Fukusho et al. | 348/340 |
| 2005/0051860 A1 * | 3/2005 | Takeuchi et al. | 257/436 |

FOREIGN PATENT DOCUMENTS

| | | |
|---|---|---|
| JP | 06-151792 | 5/1994 |
| JP | 10-070263 | 3/1998 |
| JP | 10173998 A | 6/1998 |

* cited by examiner

SOLID-STATE IMAGE PICKUP DEVICE AND DRIVING METHOD OF SOLID-STATE IMAGE PICKUP DEVICE

This application is a divisional of co-pending U.S. patent application Ser. No. 10/854,422 filed May 26, 2004, entitled, "SOLID-STATE IMAGE PICKUP DEVICE AND DRIVING METHOD OF SOLID-STATE IMAGE PICKUP DEVICE" and claims priority to Japanese Application No. P2003-156122 filed Jun. 2, 2003, both of which are hereby incorporated by reference.

BACKGROUND OF THE INVENTION

The present invention relates to a solid-state image pickup device and a driving method of a solid-state image pickup device, and particularly to a solid-state image pickup device and a driving method of a solid-state image pickup device that perform readout by making a potential of a vertical charge transfer region (hereinafter referred to as a vertical CCD) sufficiently deep and extending a depletion layer of the vertical CCD in a direction of a sensor by a voltage applied to a vertical transfer electrode.

In a unit pixel structure of an interline (IT type) CCD solid-state image pickup device, which is the current mainstream of CCD solid-state image pickup devices, and a frame interline (FIT type) CCD solid-state image pickup device used for broadcasting stations and the like, basically as shown in a schematic structural sectional view of FIG. 1 and a plan layout view of FIG. 2 (a scale of FIG. 2 does not correspond with a scale of FIG. 1), a sensor region 121 for performing photoelectric conversion and charge accumulation is formed in a P-type well 112 formed in a semiconductor substrate 110. Formed on one side of the sensor region 121 are a readout gate region 122 for transferring a charge to a vertical CCD and the vertical CCD 123 for transferring the charge read out by the readout gate region 122, with the readout gate region 122 intermediate between the sensor region 121 and the vertical CCD 123. Further, a channel stop region 125 is formed between the pixel 111 and a pixel (not shown) adjacent to the pixel 111. Further, a transfer electrode 127 is formed on the vertical CCD 123 (including a channel region 124), the readout gate region 122, and the channel stop region 125 with an insulating film 126 interposed between the transfer electrode 127, and the vertical CCD 123, the readout gate region 122, and the channel stop region 125. Further, an opening 130 is formed on the sensor region 121, and a light shielding electrode 129 for covering the transfer electrode 127 is formed with an interlayer insulating film 128 interposed between the transfer electrode 127 and the light shielding electrode 129 (see Patent Literature 1, for example).

In a case of construction of a CCD having a pixel 2.5 μm square, for example, supposing that the channel stop region 125 has a width of 0.35 μm, the readout gate region 122 has a width of 0.35 μm, and the sensor region 121 has a width of 1.0 μm, the channel region 124 of the vertical CCD 123 has a width of 0.8 μm. With the conventional structure, it is becoming difficult to maintain characteristics regarding sensitivity, an amount of charge handled by the sensor region 121, smears, an amount of charge handled by the vertical CCD 123, and the like as CCD unit cells are scaled down.

In order to solve these problems, a solid-state image pickup device of a punch-through readout structure has been disclosed (see Non-Patent Literature 1 and Patent Literature 2, for example).

[Patent Literature 1]
Japanese Patent Laid-Open No. Hei 6-151792 (pp. 2-3, FIG. 1)
[Patent Literature 2]
Japanese Patent Laid-Open No. Hei 10-70263 (pp. 3-4, FIG. 1)
[Non-Patent Literature 1]
Toshifumi Ozaki, H. Ono, H. Tanaka, A. Sato, M. Nakai, and T. Nishida, IEEE TRANSACTION ON ELECTRON DEVICES, VOL. 41, NO. 7, (1994), PP. 1128-1134

In order to increase the amount of charge handled by the vertical CCD without increasing the area, there is a method of increasing the capacitance by forming a thinner gate insulating film or densely forming a channel dopant. However, these methods have a disadvantage of making charge transfer difficult. While increase in driving amplitude of the vertical CCD results in increase of the amount of charge handled, VHigh voltage is set as negative voltage in a present situation because plus side driving of VHigh in the conventional structure increases dark current.

SUMMARY OF THE INVENTION

The present invention has been made to solve the above problems, and it is accordingly an object of the present invention to provide a solid-state image pickup device and a driving method of a solid-state image pickup device.

According to the present invention, there is provided a solid-state image pickup device including: a pixel region on a substrate, the pixel region including: a sensor region for photoelectrically converting incident light; a vertical charge transfer region formed on one side of the sensor region with a readout region interposed between the sensor region and the vertical charge transfer region; and a channel stop region formed on a side opposite from the sensor region with the vertical charge transfer region interposed between the sensor region and the channel stop region; and a vertical transfer electrode on the vertical charge transfer region with an insulating film interposed between the vertical transfer electrode and the vertical charge transfer region. The vertical transfer electrode is formed above the vertical charge transfer region such that width of the vertical transfer electrode and channel width of the vertical charge transfer region are substantially equal to each other.

According to the present invention, there is provided a driving method of a solid-state image pickup device, the solid-state image pickup device including: a pixel region on a substrate, the pixel region including: a sensor region for photoelectrically converting incident light; a vertical charge transfer region formed on one side of the sensor region with a readout region interposed between the sensor region and the vertical charge transfer region; and a channel stop region formed on a side opposite from the sensor region with the vertical charge transfer region interposed between the sensor region and the channel stop region; and a vertical transfer electrode on the vertical charge transfer region with an insulating film interposed between the vertical transfer electrode and the vertical charge transfer region. The vertical transfer electrode is formed above the vertical charge transfer region such that width of the vertical transfer electrode and channel width of the vertical charge transfer region are substantially equal to each other. An amplitude range of driving voltage of the solid-state image pickup device includes positive voltage.

In the solid-state image pickup device and the driving method of the solid-state image pickup device, the vertical transfer electrode is provided on the vertical charge transfer region with the insulating film interposed between the vertical transfer electrode and the vertical charge transfer region, the vertical transfer electrode being formed above the vertical charge transfer region (hereinafter referred to as the vertical CCD) such that the width of the vertical transfer electrode and the channel width of the vertical CCD are substantially equal to each other. Therefore the vertical transfer electrode does not extend over the channel stop region and the readout region. That is, the channel stop region can be covered by a light shielding electrode set at a negative voltage. A readout operation in the readout region is performed by making a potential of the vertical CCD sufficiently deep and extending a depletion layer of the vertical CCD in a direction of the sensor region by a voltage applied to the vertical transfer electrode.

An amount of charge handled by the vertical CCD is in a substantially proportional relation to driving amplitude. That is, from a relation Q (amount of charge)=C (capacitance)×V (voltage), Q is proportional to V when C is substantially constant. Thus, since a voltage VHigh on the high voltage side of driving voltage of the vertical CCD drives the vertical CCD as a positive voltage instead of driving the vertical CCD at 0 V as in the conventional solid-state image pickup device, the driving amplitude can be increased.

Positive voltage driving of VHigh of the conventional vertical CCD depletes an interface between silicon and silicon oxide of the channel stop region, and therefore increases dark current as compared with driving of VHigh=0 V and VHigh=negative voltage. On the other hand, the present invention can avoid depletion of the channel stop region even when the VHigh value of the driving voltage of the vertical CCD is on a positive voltage side, because the light shielding electrode set at a negative voltage can cover the channel stop region. Since the light shielding electrode that can be set at a negative voltage lies over the channel stop region, the channel stop region can be pinned by holes by setting the light shielding electrode at a negative voltage, and thus dark current can be reduced as compared with the conventional solid-state image pickup device.

In addition, since the vertical transfer electrode is situated over the channel region of the vertical CCD without extending in a direction of the readout region, even when VHigh is a positive voltage of a few volts, resistance to blooming from the sensor region can be maintained. The value of the positive voltage VHigh can be set at about 3 V or lower, for example.

It is generally known that smear characteristics depend greatly on length of an extending portion of the light shielding electrode. Specifically, as the extension of the light shielding electrode is increased, the channel region of the vertical CCD and the opening of the sensor region become more distant from each other, thus enhancing resistance to smears caused by oblique incident light. The vertical transfer electrode in the solid-state image pickup device according to the present invention is formed such that the width of the vertical transfer electrode is narrower than the width of the vertical transfer electrode of the conventional solid-state image pickup device. Thus, the length of extension of the light shielding electrode can be increased on both a right side and a left side, whereby smears are reduced.

In readout of a signal charge from the sensor region to the vertical CCD in the solid-state image pickup device according to the present invention, a positive voltage (for example about 10 V to 15 V) is applied as a readout voltage to the vertical transfer electrode to extend a depletion layer of the vertical CCD in a horizontal direction, and a potential between the sensor region and the vertical CCD in the silicon substrate is set intermediate between a potential value of the vertical CCD and a potential value of the sensor region. Thereby the signal charge can be transferred completely.

DETAILED DESCRIPTION OF THE PREFERRED EMBODIMENT

An embodiment of a solid-state image pickup device and a driving method of a solid-state image pickup device according to the present invention will be described with reference to a schematic structural sectional view of FIG. 3.

Figure 1:
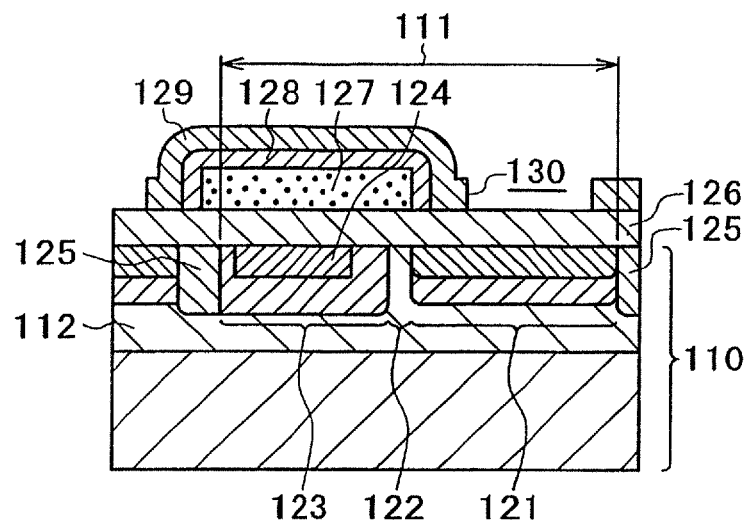
FIG. 1 is a schematic structural sectional view of a conventional solid-state image pickup device.
Figure 2:
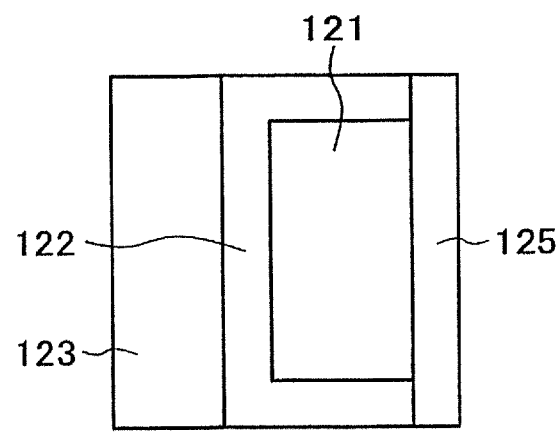
FIG. 2 is a plan layout view of the conventional solid-state image pickup device.
Figure 3:
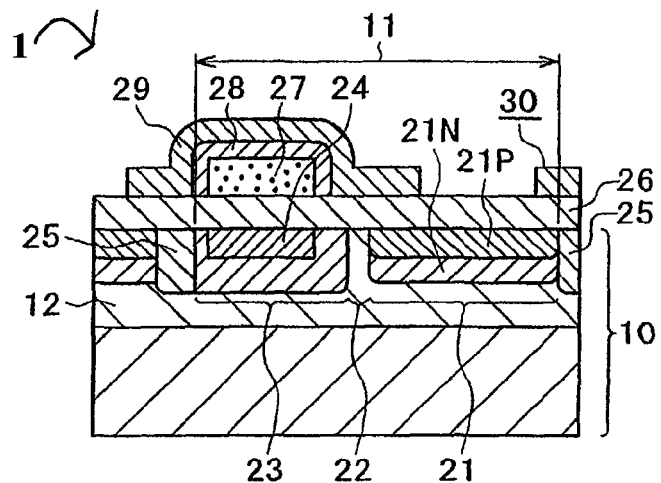
FIG. 3 is a schematic structural sectional view of an embodiment of a solid-state image pickup device and a driving method of a solid-state image pickup device according to the present invention.

As shown in FIG. 3, a plurality of pixel regions 11 are formed on a semiconductor substrate 10. The pixel regions 11 have the same layout as in an ordinary IT type or FIT type solid-state image pickup device. Incidentally, the figure shows one pixel region.

A sensor region 21 for performing photoelectric conversion and charge accumulation is formed in a P-type well 12 formed in an upper portion of the semiconductor substrate (for example a silicon substrate) 10. This sensor region 21 is constructed by forming an N-type impurity region 21N in a lower layer of the sensor region 21 and forming a P-type impurity region 21P in an upper layer of the sensor region 21, for example. Formed on one side of the sensor region 21 are a readout region 22 for transferring a charge to a vertical CCD and the vertical CCD 23 for transferring the charge read out by the readout gate region 22, with the readout region 22 intermediate between the sensor region 21 and the vertical CCD 23. The vertical CCD 23 is formed of an N-type impurity region and an N$^+$-type impurity region as a channel region 24 formed in a layer on the N-type impurity region. Further, a P-type channel stop region 25 is formed between the pixel 11 and a pixel (not shown) adjacent to the pixel 11. Further, a vertical transfer electrode 27 is provided on the channel region 24 of the vertical CCD 23 with an insulating film 26 intermediate between the channel region 24 and the vertical transfer electrode 27. Specifically, the vertical transfer electrode 27 is formed above the channel region 24 of the vertical CCD 23 such that width of the vertical transfer electrode 27 and width of the channel region 24 of the vertical CCD 23 are substantially equal to each other. Thus, the vertical transfer electrode 27 is formed so as not to overlap the readout region 22 and the channel stop region 25.

Further, an interlayer insulating film 28 for covering the vertical transfer electrode 27 and the like is formed. A light shielding electrode 29 is formed on the interlayer insulating film 28. An opening 30 is formed on the sensor region 21. A negative voltage (for example −2 V to −10 V) is applied to the light shielding electrode 29.

In the solid-state image pickup device 1 thus formed, as for a voltage VLow on a low voltage side and a voltage VHigh on a high voltage side of driving amplitude values in the vertical CCD 23, VLow is −10 V to −5 V and VHigh is a positive voltage. The positive voltage is up to 3 V, for example.

A signal charge in the solid-state image pickup device 1 is read and outputted from the sensor region 21 to the vertical CCD 23 by applying a readout voltage $V_T$ to the vertical transfer electrode 27 and modulating and controlling a potential of the channel region 24 of the vertical CCD 23 and a potential of the readout region 22 by the readout voltage $V_T$. That is, the voltage applied to the vertical transfer electrode 27 makes a potential of the vertical CCD 23 sufficiently deep and extends a depletion layer of the vertical CCD 23 in a direction of the sensor region 21, whereby the reading and output is performed.

An amount of charge Q handled by the vertical CCD 23 has a relation Q=C (capacitance)×V (voltage), and is thus proportional to V when C is substantially constant. That is, the amount of charge Q handled by the vertical CCD 23 is in a substantially proportional relation to driving amplitude of the vertical CCD 23. Thus, since the voltage VHigh on the high voltage side of driving voltage of the vertical CCD 23 drives the vertical CCD 23 as a positive voltage, the driving amplitude can be increased.

Positive voltage driving of VHigh of the conventional vertical CCD depletes an interface between silicon and silicon oxide of a channel stop region, and therefore increases dark current as compared with driving of VHigh=0 V and VHigh=negative voltage. On the other hand, the present invention can avoid depletion of the channel stop region 25 even when the VHigh value of the driving voltage of the vertical CCD 23 is on a positive voltage side, because the light shielding electrode 29 set at a negative voltage covers the channel stop region 25. Since the light shielding electrode 29 that can be set at a negative voltage lies over the channel stop region 25, the channel stop region 25 can be pinned by holes by setting the light shielding electrode 29 at a negative voltage, and thus dark current can be reduced as compared with the conventional solid-state image pickup device.

In addition, since the vertical transfer electrode 27 is situated over the channel region 24 of the vertical CCD 23 without extending in a direction of the readout region 22, even when VHigh is a positive voltage of a few volts, resistance to blooming from the sensor region 21 can be maintained. The value of the positive voltage VHigh can be set at about 3 V or lower, for example.

It is generally known that smear characteristics depend greatly on length of an extending portion of the light shielding electrode 29 at a portion under the vertical transfer electrode 27. Specifically, as the extension of the light shielding electrode 29 is increased, the channel region 24 of the vertical CCD 23 and the opening 30 of the sensor region 21 become more distant from each other, thus enhancing resistance to smears caused by oblique incident light. The vertical transfer electrode 27 in the solid-state image pickup device 1 according to the present invention is formed such that the width of the vertical transfer electrode 27 is equal to the width of the channel region 24. The vertical transfer electrode 27 therefore has a narrower width than the vertical transfer electrode of the conventional solid-state image pickup device. Thus, the length of extension of the light shielding electrode 29 can be increased on both the readout region 22 side and the channel stop region 25 side by amounts corresponding to conventional overlaps over the readout gate region and the channel stop region, whereby smears are reduced.

In readout of a signal charge from the sensor region 21 to the vertical CCD 23 in the solid-state image pickup device 1 according to the present invention, a positive voltage $V_T$ (for example about 10 V to 15 V) is applied as a readout voltage to the vertical transfer electrode 27 to extend a depletion layer of the vertical CCD 23 in a horizontal direction, and a potential between the sensor region 21 and the vertical CCD 23 in the semiconductor substrate 10 is set intermediate between a potential value of the vertical CCD 23 and a potential value of the sensor region 21. Thereby the signal charge can be transferred completely.

Description will next be made of a range of driving voltages of a vertical CCD in an IT type CCD solid-state image pickup device with a cell size 2.5 μm square as an example. In this case, it is assumed for example that the number of electrons handled by a photodiode forming a sensor region is about ten thousand, and that 12 V is required as a voltage for reading from the photodiode. It is also a technically reasonable assumption in the CCD of such a cell size that an electrostatic potential of the photodiode in an empty state (empty level) is about 5 V and that the potential of the photodiode in a full state (full level) is about 1 V.

Figure 4:
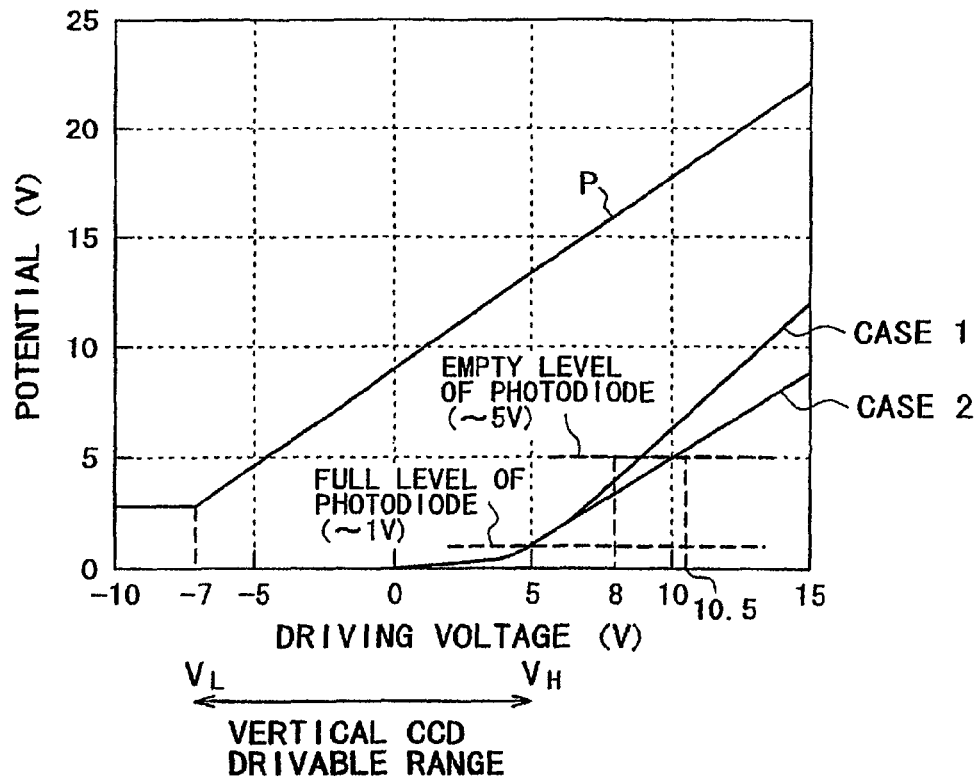
FIG. 4 is a diagram of a relation between potential and transfer electrode voltage.

As shown in FIG. 4, which is a diagram of a relation between potential (the axis of ordinates) and transfer electrode voltage (the axis of abscissas), a potential curve P of the vertical CCD is set as shown in the figure when a value on a low voltage (VLow) side of driving voltage of the vertical CCD is given. The VLow value in a normal solid-state image pickup device is about −7 V. A maximum potential of a section (transfer region) connecting the photodiode with the vertical CCD determines the voltage for reading from the photodiode, blooming characteristics and the like. By appropriately setting impurity profiles of the vertical CCD and the photodiode, and length, width, and impurity concentration of the transfer region, characteristic curves in case 1 and case 2 are obtained from simulation as potential curves of the transfer region. Since the electrostatic potential of the photodiode at an empty level is set at about 5 V, it is shown that readout from the photodiode is made possible at about 8 V as a readout voltage for the characteristic curve in case 1 and at about 10.5 V for the characteristic curve in case 2. In both case 1 and case 2, the potential of the transfer region becomes equal to the potential of the photodiode at a full level (1 V or less) when $V_H$ is about 5 V. Hence, a value of 5 V or less is selected as a $V_H$ value for preventing blooming. Thus a drivable range of the vertical CCD is −7 V to +5 V in this case. It is desirable, however, to allow a margin of about 2 V for manufacturing variations and thus select $V_H$=3 V. Hence, the drivable range of the vertical CCD is desirably −7 V to +3 V in this case.

As described above, the solid-state image pickup device and the driving method of the solid-state image pickup device according to the present invention make it possible to set the high voltage VHigh side of the driving voltage of the vertical CCD as positive voltage while maintaining blooming resistance, and thereby increase a VHigh-VLow value as the driving amplitude of the vertical CCD. Thus, the amount of charge handled by the vertical CCD can be increased. Thereby an IT CCD solid-state image pickup device and an FIT CCD solid-state image pickup device having a wide dynamic range can be obtained.

In addition, the vertical transfer electrode is formed over the channel region of the vertical CCD such that the width of the vertical transfer electrode is substantially equal to the width of the channel region of the vertical CCD. Therefore an area of a portion of the light shielding electrode which portion is not situated over the vertical transfer electrode (a so-called eaves portion of the light shielding electrode) can be made wider as compared with the existing solid-state image pickup device. Thus, smear characteristics, which depend greatly on length of the eaves portion of the light shielding electrode, are improved, so that a low-smear IT CCD solid-state image pickup device and a low-smear FIT CCD solid-state image pickup device can be obtained.

Further, since the vertical transfer electrode does not overlap the channel stop region and the light shielding electrode covers the channel stop region, dark current, which tends to be generated from the channel stop region, can be suppressed effectively by making voltage of the light shielding electrode a negative voltage. Further, the readout region between the sensor region and the vertical CCD can be made to be a shorter channel. Thus the sensor region can be correspondingly extended, thereby improving sensitivity to received light.

What is claimed is:

1. A method of driving a solid-state image pickup device, said driving method comprising:
    providing a pixel region on a substrate, said pixel region including
        (a) a sensor region for photoelectrically converting incident light,
        (b) a vertical charge transfer region formed on one side of said sensor region with a readout region interposed between said sensor region and said vertical charge transfer region,
        (c) a channel stop region formed on a side of said sensor region opposite said vertical charge transfer region,
        (d) a vertical transfer electrode on said vertical charge transfer region with an insulating film interposed between said vertical transfer electrode and said vertical charge transfer region, said vertical transfer electrode being formed above said vertical charge transfer region such that a width of said vertical transfer electrode and a channel width of said vertical charge transfer region are substantially equal to each other,
        (e) a light shielding electrode over said vertical transfer electrode and having (i) a first base extension portion that extends over said channel stop region from one side of said vertical transfer electrode, said first base extension portion being in contact with the insulating film, said contact of said first base extension portion and the insulating film occurring over said entire channel stop region such that a portion of the insulating film is abutted by both the first base extension portion and the entire channel stop region in a thickness direction, and (ii) a second base extension portion that extends over said sensor region from an opposite side of said vertical transfer electrode such that the second base extension portion is in contact with the insulating film and extends across the readout region into the sensor region to shield a portion of said sensor region from light, and
        (f) an interlayer insulating film interposed between said light shielding electrode and said vertical transfer electrode, the interlayer insulating film not overlapping the channel stop region, the interlayer insulating film covering top and side surfaces of the vertical transfer electrode while not overlapping the readout region in the thickness direction; and
    applying an amplitude range of driving voltage of said solid-state image pickup device with a low voltage side of said amplitude range of a negative voltage and a high voltage side of said amplitude range of a positive voltage.

2. The method of claim 1, wherein a voltage VLow on a low voltage side of driving voltage amplitude values in said vertical charge transfer region is −10V to −5V, and a voltage VHigh on a high voltage side of the driving voltage amplitude values in said vertical charge transfer region is a positive voltage.

3. The method of claim 1, wherein:
    said pixel region further comprises an opening on said photoelectrically converting sensor region; and
    said method further comprises applying a negative voltage to said light shielding electrode.

4. The method of claim 1, further comprising:
    reading and outputting a signal charge from said sensor region to said vertical charge transfer region by applying a readout voltage $V_T$ to said vertical transfer electrode and modulating and controlling a potential of a channel of said vertical charge transfer region and a potential of a readout region by said readout voltage $V_T$.

5. The method of claim 1, wherein the interlayer insulating film has end surfaces on either end of the insulating film with at least one of the end surfaces abutting said insulating film.

6. The method of claim 5, wherein the light shielding electrode abuts said interlayer insulating film and said insulating film.

7. The method of claim 1, wherein the first base extension portion extends along the substrate and beyond the channel stop region to shield another portion of said sensor region.

8. The method of claim 1, wherein said sensor region includes a p-type layer stacked on top of an n-type layer such that the p-type layer abuts the n-type layer.

9. The method of claim 8, wherein the p-type layer is beneath the first and second base extensions of the light shielding electrode and is spaced therefrom only by the insulating film.

10. The method of claim 1, further comprising:
    during readout of a signal charge, setting a potential between the sensor region and the vertical charge transfer region to be an intermediate value, said intermediate value being between a potential value of the vertical charge transfer region and a potential value of the sensor region.

* * * * *